(12) United States Patent
Harada et al.

(10) Patent No.: US 7,282,095 B2
(45) Date of Patent: Oct. 16, 2007

(54) SILICON SINGLE CRYSTAL PULLING METHOD

(75) Inventors: Kazuhiro Harada, Tokyo (JP); Norihito Fukatsu, Tokyo (JP); Senlin Fu, Tokyo (JP); Yoji Suzuki, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 10/561,820

(22) PCT Filed: Jan. 25, 2005

(86) PCT No.: PCT/JP2005/000882

§ 371 (c)(1), (2), (4) Date: Feb. 1, 2007

(87) PCT Pub. No.: WO2005/073440

PCT Pub. Date: Aug. 11, 2005

(65) Prior Publication Data

US 2007/0119365 A1    May 31, 2007

(30) Foreign Application Priority Data

Jan. 30, 2004    (JP) ............................. 2004-022372

(51) Int. Cl.
*C30B 15/20*    (2006.01)
(52) U.S. Cl. ......................... 117/30; 117/32; 117/217; 117/218; 117/917
(58) Field of Classification Search ................ 117/30, 117/32, 217, 218, 917
See application file for complete search history.

(56) References Cited

U.S. PATENT DOCUMENTS 6,045,610 A    4/2000    Park et al.
2002/0157600 A1    10/2002    Fusegawa et al.

FOREIGN PATENT DOCUMENTS

| JP | 60-033291 | 2/1985 |
| JP | 04-031386 | 2/1992 |
| JP | 11-001393 | 6/1999 |
| JP | 2002-201092 | 7/2002 |
| JP | 2003-002783 | 1/2003 |
| JP | 2003-220875 | 5/2003 |
| WO | 01/63027 | 8/2001 |

*Primary Examiner*—Felisa Hiteshew
(74) *Attorney, Agent, or Firm*—Reed Smith LLP

(57) ABSTRACT

[Problem] A silicon single crystal ingot in which point defect agglomerates do not exist over a substantially entire length thereof is manufactured without reducing a pure margin.

[Solving Means] A heat shielding member 36 comprises a bulge portion 41 which is provided to bulge in an in-cylinder direction at a lower portion of a cylindrical portion 37 and has a heat storage member 47 provided therein. A flow quantity of an inert gas flowing down between the bulge portion 41 in the heat shielding member 36 and an ingot 25 when pulling up a top-side ingot 25a of the silicon single crystal ingot 25 is set larger than a flow quantity of the inert gas flowing down between the bulge portion 41 and the ingot 25 when pulling up a bottom-side ingot 25b of the silicon single crystal ingot 25, thereby pulling up the ingot 25. Alternatively, an intensity of a cusp magnetic field 53 when pulling up the top-side ingot 25a is set higher than an intensity of the cusp magnetic field 53 when pulling up the bottom-side ingot 25b.

3 Claims, 8 Drawing Sheets

PULLING LENGTH OF INGOT

SILICON SINGLE CRYSTAL PULLING METHOD

CROSS-REFERENCE TO RELATED APPLICATIONS

This application claims priority of International Application No. PCT/JP2005/000882, filed Jan. 25, 2005 and Japanese Application No. 2004-022372, filed Jan. 30, 2004, the complete disclosures of which are hereby incorporated by reference.

TECHNICAL FIELD OF THE INVENTION

The present invention relates to a method of pulling up a silicon single crystal ingot from a silicon melt while applying a cusp magnetic field to the silicon melt.

BACKGROUND ART

As a silicon single crystal manufacturing method, there has been conventionally known a method of pulling up a silicon single crystal ingot by a Czochralski method (which will be referred to as a CZ method thereinafter). According to this CZ method, a seed crystal is brought into contact with a silicon melt trapped in a quartz crucible, and the seed crystal is pulled upward while rotating the quartz crucible and the seed crystal, thereby forming an elongated neck portion at a lower portion of the seed crystal. Then, this portion is thickened to provide a fixed-diameter portion having a predetermined diameter by adjusting a rate of pulling and a temperature, and thereafter the crystal seed is pulled upward while rotating in accordance with crystal growth so that single crystal having a fixed diameter is grown. A crystal diameter of the single crystal which has reached a predetermined length is gradually decreased from the fixed-diameter portion, the diameter is eventually reduced to zero, and the single crystal is separated from the silicon melt.

Various ingenuities have been exercised with respect to such a CZ method in order to stably manufacture single crystal. For example, a crystal to be pulled upward is rotated around a central axis and also a quartz crucible in which a silicon melt is trapped is rotated in a direction opposite to that of the crystal, or a wire is used for pulling, or an SiO gas generated when a pressure of an inert gas is reduced is removed from an in-chamber atmosphere. Further, it is known that oxygen in a silicon single crystal produced by the CZ method plays a major part when manufacturing a device. For example, it is required in order to maintain strength of a silicon wafer. Furthermore, it is known that an oxygen precipitate generated by performing a heat treatment getters an impurity which is mixed from a surface of a silicon wafer. However, when a quantity of this oxygen is too large, an oxygen precipitate deteriorates device characteristics in the vicinity of a wafer surface. Therefore, an oxygen concentration must be controlled at a fixed level, but an oxygen concentration of an ingot pulled upward by the conventional CZ method is high on a top side of the ingot as shown in FIG. 12, and it is difficult to reduce the oxygen concentration when a quantity of a melt is increased.

In order to solve this problem, there has been known a method which pulls a silicon single crystal ingot upward from a silicon melt while applying a cusp magnetic field to the silicon melt. In order to generate this cusp magnetic field, an upper coil and a lower coil are arranged with a predetermined gap therebetween in a vertical direction outside a chamber in which a quart crucible is provided. Moreover, a cusp magnetic field which runs through a neutral plane between the upper coil and the lower coil from each coil center of the upper coil and the lower coil by passing currents opposite to each other to the upper coil and the lower coil. When the cusp magnetic field is generated, a reversed force (a Lorentz force) is applied to the silicon melt by an induced current produced in a direction vertical to the magnetic field, and free movement of the silicon melt trapped in the quartz crucible is thereby avoided. It is considered that a quantity of oxygen which enters the melt from the quartz crucible is reduced as a result of this phenomenon, whereby a quantity of oxygen which enters the crystal is lowered. However, an oxygen concentration is reduced with crystal growth like a case where a magnet is not used, and a rotating speed of the quartz crucible or a flow rate of an inert gas between a surface of the melt and a heat shielding member must be changed in order to uniform the oxygen concentration in a direction of a crystal axis.

On the other hand, in a process of manufacturing a semiconductor integrated circuit, as factors which reduce a yield ratio, there are a small defect of an oxygen precipitate which becomes a nucleus of an oxidation induced stacking fault (which will be referred to as an OISF hereinafter), a crystal originated particle (which will be referred to as a COP hereinafter) caused by a crystal, presence of interstitial-type large dislocation (which will be referred to as LD hereinafter) and others. As to OISF, a small defect which becomes a nucleus of a crystal is introduced during crystal growth, it is actualized in a thermal oxidation process or the like when manufacturing a semiconductor device, and it becomes a factor of a defect such as an increase in a leak current of the manufactured device. Additionally, the COP is a pit caused due to a crystal which appears on a wafer surface when a mirror-polished silicon wafer is cleansed by using a mixed liquid of ammonia and hydrogen peroxide. This COP becomes a factor which deteriorates electrical characteristics such as time dependent breakdown (TDDB) characteristics of an oxide film, time zero dielectric breakdown (TZDB) characteristics of an oxide film and others. Further, when the COP exists on a wafer surface, a step is generated in a wiring line process of a device, which can be a factor of disconnection. Additionally, it can be also a factor of leak or the like in an element isolation portion, thereby lowering a production yield. Furthermore, the LD becomes a factor which deteriorates electrical characteristics such as leak characteristics, isolation characteristics and others. As a result, it is necessary to reduce the OISF, the COP and the LD from a silicon wafer which is used in order to manufacture a semiconductor integrated circuit.

There has been proposed a silicon single crystal ingot manufacturing method which cuts out a defect-free silicon wafer which does not have the OISF, the COP and LD (see, e.g., Patent References 1 and 2). In general, a region [V] in which vacancy point defect agglomerates dominantly exist is formed in a silicon single crystal ingot when the ingot is pulled up at a high speed, and a region [I] in which interstitial silicon point defect agglomerates dominantly exist is formed in the ingot when the ingot is pulled up at a low speed. Therefore, according to the above-described manufacturing method, it is possible to produce a silicon single crystal formed of a perfect region [P] in which the above-mentioned point defect agglomerates do not exist by pulling up the ingot at an appropriate pulling rate.

Patent Reference 1: U.S. Pat. No. 6,045,610
Patent Reference 2: Japanese Unexamined Patent Application Publication No. 1393-1999.

DISCLOSURE OF THE INVENTION

Problems to be Solved by the Invention

However, when a rotating speed of a quartz crucible or a flow rate of an inert gas is changed while applying a cusp magnetic field to a silicon melt in order to control a quantity of oxygen which is taken into a crystal as described above, this control is affected by a change in a residual quantity of the silicon melt or a change in a convection, a defect-free silicon single crystal is hence hard to be manufactured over an entire length of a body portion of an ingot even if an oxygen concentration can be maintained constant, and there still remains a problem to be solved, namely, a pure margin which is a difference between a maximum pulling rate and a minimum pulling rate which provides a perfect region in which point defect agglomerates do not exist is reduced across an entire lateral cross section of the ingot.

It is an object of the present invention to provide a silicon single crystal pulling method which can manufacture an ingot of a silicon single crystal in which point defect agglomerates do not exist over a substantially entire length without reducing a pure margin.

Means for Solving the Problems

As shown in FIGS. 1 to 4, the invention according to claim 1 is an improvement in a silicon single crystal pulling method comprising: arranging an upper coil 51 and a lower coil 52 at a predetermined gap therebetween in a vertical direction outside a chamber 11 in which a quartz crucible 13 is provided; generating a cusp magnetic field 53 having an intensity of 50 gausses or above which runs through a neutral plane 53a between the upper coil 51 and the lower coil 52 from respective coil centers of the upper coil 51 and the lower coil 52 by allowing opposite currents to flow through the upper coil 51 and the lower coil 52; rotating the quartz crucible 13 at a predetermined rotating speed; supplying an inert gas into the chamber 11 from an upper part of the chamber 11 so that the inert gas flows down in a heat shielding member 36 provided in the chamber; rotating a silicon single crystal ingot 25 including a top-side ingot 25a and a bottom-side ingot 25b at a predetermined rotating speed from a silicon melt 12; and pulling the silicon single crystal ingot 25 from the center of the heat shielding member 36 at a pulling rate with which the inside of the silicon single crystal ingot 25 becomes a perfect region in which interstitial silicon point defect agglomerates and vacancy point defect agglomerates do not exist.

Its characteristic point is that the heat shielding member 36 comprises a cylindrical portion 37 whose lower end is positioned above a surface of the silicon melt 12 with a gap therebetween and which surrounds an outer peripheral surface of the ingot 25 and a bulge portion 41 which is provided to bulge in an in-cylinder direction at a lower portion of the cylindrical portion 37 and has a heat storage member 47 provided therein, an inner peripheral surface of the heat storage member 47 is formed in such a manner that its height $H_1$ is not smaller than 10 mm and not greater than d/2 and its minimum gap $W_1$ with respect to an outer peripheral surface of the ingot 25 is not smaller than 10 mm and not greater than 0.2d where d is a diameter of the ingot 25 and is not less than 100 mm, and a flow quantity of an inert gas flowing down between the bulge portion 41 and the ingot 25 when pulling up the top-side ingot 25a of the silicon single crystal ingot 25 is larger than a flow quantity of the inert gas flowing down between the bulge portion 41 and the ingot 25 when pulling up the bottom-side ingot 25b of the silicon single crystal ingot 25.

In this silicon single crystal pulling method according to claim 1, a quantity of oxygen taken into the crystal in the bottom-side ingot 25b is increased due to a reduction in a concentration of oxygen removed from the silicon melt surface involved by pulling. As a result, it is possible to manufacture the silicon single crystal ingot 25 having a relatively uniform oxygen concentration. On the other hand, it was revealed that, under the condition that no magnet is used, a pure margin which is a difference between a maximum pulling rate which results in a perfect region where point defect agglomerates do not exist and a minimum pulling rate correlates with a flow quantity of the inert gas, and a reduction in the flow quantity of the inert gas thereby decreases the margin (Japanese Patent Application Laid-open No. 2003-220875). However, it was discovered that the margin is not decreased even if the flow quantity is reduced in the bottom-side ingot according to the present invention. Although a factor of this phenomenon is not clear, a reduction in the silicon melt changes a magnetic field distribution concerning the melt. It can be considered that a melt convention varies due to this change and hence the margin is not decreased as different from the case where no magnetic field is provided.

The invention according to claim 2 is the invention defined in claim 1, and provides a silicon single crystal pulling method in which a flow rate index S obtained by the following Equation (1) of an inert gas flowing down between the bulge portion 41 and the ingot 25 when pulling up the top-side ingot 25a is set higher than a flow rate index S obtained by the following Equation (1) of the inert gas flowing down between the bulge portion 41 and the ingot 25 when pulling up the bottom-side ingot 25b:

$$S=(Po/E)\times F/A \tag{1}$$

where Po is an atmospheric pressure (Pa) outside the chamber 11, E is an internal pressure (Pa) of the chamber 11, F is a flow quantity (m³/second) under the pressure Po (Pa) of the inert gas supplied into the chamber 11 in a room temperature state, and A is a cross-sectional area (m²) between the bulge portion 41 and the silicon single crystal ingot 25.

In this silicon single crystal pulling method according to claim 2, a change in a convention of the silicon melt 12 due to a reduction in the silicon melt 12 in the quartz crucible 13 involved by pulling of the ingot 25 can be suppressed to the minimum level. As a result, it can be considered that a temperature gradient G in a direction perpendicular to the ingot 25 in the vicinity of a solid-liquid interface between the silicon melt 12 and the ingot 25 is substantially uniformly distributed in a radial direction of the ingot 25 over a substantially entire length of the ingot 25, point defect agglomerates are not generated in a direction of pulling up the ingot 25, and the ingot 25 having a perfect region over the substantially entire length thereof can be pulled upward. Accordingly, according to such a silicon single crystal pulling method, it is possible to manufacture a silicon single crystal ingot in which point defect agglomerates do not exist over the substantially entire length thereof without reducing a pure margin.

The invention according to claim 3 is an improvement in a silicon single crystal pulling method comprising: arranging an upper coil 51 and a lower coil 52 with a predetermined gap therebetween in a perpendicular direction outside a chamber 11 in which a quartz crucible 13 is provided;

generating a cusp magnetic field 53 which runs through a neutral plane 53a between the upper coil and the lower coil from respective coil centers of the upper coil and the lower coil by allowing opposite currents to flow through the upper coil 51 and the lower coil 52; rotating the quartz crucible 13 at a predetermined rotating speed; rotating a silicon single crystal ingot 25 including a top-side ingot 25a and a bottom-side ingot 25b from a silicon melt 12 at a predetermined rotating speed; and pulling the silicon single crystal ingot 25 from a center of a heat shielding member 36 provided in the chamber 11 at a pulling rate with which a perfect region where interstitial silicon point defect agglomerates and vacancy point defect agglomerates do not exist is provided in the silicon single crystal ingot 25.

Its characteristic point is that the heat shielding member 36 comprises a cylindrical portion 37 whose lower end is positioned above a surface of the silicon melt 12 with a gap therebetween and which surrounds an outer peripheral surface of the ingot 25 and a bulge portion 41 which is provided to bulge in an in-cylinder direction at a lower portion of the cylindrical portion 37 and has a heat storage member 47 provided therein, an inner peripheral surface of the heat storage member 47 is formed in such a manner that its height $H_1$ is not smaller than 10 mm and not greater than d/2 and its minimum gap $W_1$ with respect to the outer peripheral surface of the ingot 25 is not smaller than 10 mm and not greater than 0.2d mm where d is a diameter of the ingot 25 and not smaller than 100 mm, and an intensity of the cusp magnetic field 53 when pulling up the top-side ingot 25a of the silicon single crystal ingot 25 is set higher than an intensity of the cusp magnetic field 53 when pulling up the bottom-side ingot 25b of the silicon single crystal ingot 25.

In this silicon single crystal pulling method according to claim 3, a Lorentz force caused due to an induced current generated in the silicon melt 12 by the magnetic field is lowered as compared with that in the case where the top-side ingot 25a is pulled upward, whereby relatively free movement of the silicon melt 12 trapped in the quartz crucible 13 is allowed. With this movement of the silicon melt 12, movement of oxygen in the silicon melt is also allowed, and a quantity of oxygen which is taken into the crystal in the bottom-side ingot 25b is increased. As a result, it is possible to manufacture the silicon single crystal ingot 25 having a relatively uniform oxygen concentration. On the other hand, a pure margin which is a difference between a maximum pulling rate which provides a perfect region in which point defect agglomerates do not exist across an entire lateral cross section of the ingot and a minimum pulling rate is not reduced. Although a factor of this phenomenon is not clear, it can be considered that a change in a melt convention due to a reduction in the magnetic field intensity on the bottom side affects the oxygen concentration but does not affect the margin.

Effects of the Invention

As described above, according to the present invention, since a flow quantity of the inert gas flowing down between the bulge portion and the ingot when pulling up the top-side ingot is larger than a flow quantity of the inert gas when pulling up the bottom-side ingot, or since an intensity of the cusp magnetic field when pulling up the top-side ingot is set higher than an intensity of the cusp magnetic field when pulling up the bottom-side ingot, a quantity of oxygen which is taken into the crystal in the bottom-side ingot is increased, thereby manufacturing the silicon single crystal ingot having a relatively uniform oxygen concentration. Further, a temperature gradient in an ingot perpendicular direction in the vicinity of a solid-liquid interface between the silicon melt and the ingot is substantially uniformly distributed in a radial direction of the ingot over the substantially entire length of the ingot, whereby point defect agglomerates are not generated in a direction of pulling the ingot and the ingot which has a perfect region over the substantially entire length thereof can be pulled upward.

Best Mode for Carrying out the Invention

A first embodiment according to the present invention will now be described hereinafter with reference to the accompanying drawings.

As shown in FIG. 1, a quartz crucible 13 in which a silicon melt 12 is trapped is provided in a chamber 11 of a silicon single crystal pulling apparatus 10, and an outer peripheral surface of this quartz crucible 13 is covered with a graphite susceptor 14. A lower surface of the quartz crucible 13 is fixed at an upper end of a spindle 16 through the graphite susceptor 14, and a lower portion of this spindle 16 is connected with crucible driving means 17. Although not shown, the crucible driving means 17 has a first rotation motor which rotates the quartz crucible 13 and an elevation motor which moves up and down the quartz crucible 13 so that the quartz crucible 13 can rotate in a predetermined direction and move up and down by these motors. An outer peripheral surface of the quartz crucible 13 is surrounded by a heater 18 with a predetermined gap from the quartz crucible 13, and this heater 18 is surrounded by a heat insulation cylinder 19. The heater 18 heats/melts a silicon polycrystalline substance put into the quartz crucible 13 to provide a silicon melt 12.

Furthermore, a cylindrical casing 21 is connected with an upper end of the chamber 11. Pulling means 22 is provided to this casing 21. The pulling means 22 has: a pulling head (not shown) provided at an upper end portion of the casing 21 so as to be capable of swiveling in a horizontal state; a second rotation motor (not shown) which rotates this head; a wire cable 23 suspended toward a rotation center of the quartz crucible 13 from the head; and a pulling motor (not shown) which winds up or veers out the wire cable 23 provided in the head. A seed crystal 24 which is dipped in the silicon melt 12 to pull up the silicon single crystal ingot 25 is attached at a lower end of the wire able 23.

Moreover, to the chamber 11 is connected gas supplying/discharging means 28 which supplies an inert gas to the ingot side of this chamber 11 and discharges the inert gas from a crucible inner peripheral surface side of the chamber 11. The gas supplying/discharging means 28 has a supply pipe 29 having one end connected with a circumferential wall of the casing 21 and the other end connected with a tank (not shown) in which the inert gas is trapped, and a discharge pipe 30 having one end connected with a lower wall of the chamber 11 and the other end connected with a vacuum pump (not shown). First and second flow quantity adjusting valves 31 and 32 which adjust a flow quantity of the inert gas flowing through each of these pipes 29 and 30 are respectively provided to the supply pipe 29 and the discharge pipe 30.

On the other hand, an encoder (not shown) is provided an output shaft (not shown) of the pulling motor, and an encoder (not shown) which detects a position to which the spindle 16 is moved up/down is provided to the crucible driving means 17. Respective detection outputs of the two encoders are connected with a control input of a controller (not shown), and control outputs of the controller are respectively connected with the pulling motor of the pulling means 22 and the elevation motor of the crucible driving means 17. Additionally, a memory (not shown) is provided to the controller, and a winding length of the wire cable 23 with respect to the detection outputs of the encoders, i.e., a pulling length of the ingot 25 is stored as a first map in this memory. Further, a liquid level of the silicon melt 12 in the quartz crucible 13 with respect to the pulling length of the ingot 25 is stored as a second map in the memory. The controller is configured to control the elevation motor of the crucible driving means 17 so as to always maintain the liquid level of the silicon melt 12 in the quartz crucible 13 at a fixed level based on a detection output of the encoder in the pulling motor.

A heat shielding member 36 which surrounds an outer peripheral surface of the ingot 25 is provided between the outer peripheral surface of the ingot 25 and an inner peripheral surface of the quartz crucible 13. This heat shielding member 36 has a cylindrical portion 37 which is formed into a cylindrical shape and prevents radiant heat from the heater 18, and a flange portion 38 which is provided continuously with an upper edge of this cylindrical portion 37 and protrudes in a substantially horizontal direction toward the outside. When the flange portion 38 is mounted on the heat insulation cylinder 19, the heat shielding member 36 is fixed in the chamber 11 in such a manner that a lower edge of the cylindrical portion 37 is positioned above the surface of the silicon melt 12 with a predetermined distance therebetween. The cylindrical portion 37 in this embodiment is a cylindrical body having the same diameter, and a bulge portion 41 which bulges toward the inside of the cylinder is provided at a lower portion of this cylindrical portion 37.

As shown in FIG. 3, the bulge portion 41 is constituted of an annular bottom wall 42 which is connected with the lower edge of the cylindrical portion 37 and horizontally extends to reach the vicinity of the outer peripheral surface of the ingot 25, a vertical wall 44 which is provided continuously with an inner edge of the bottom wall 42, and an upper wall 46 which is provided continuously with this vertical wall 44. In this embodiment, the cylindrical portion 37 and the bottom wall 42 are integrally formed, and the upper wall 46 and the vertical wall 44 are integrally formed. It is preferable to form this cylindrical portion 37, the bottom wall 42, the upper wall 46 and the vertical wall 44 of graphite which is thermally stable and has high purity or graphite whose surface is coated with SiC, but it is possible to use materials such as Mo (molybdenum), W (tungsten) and others which are thermally stable.

The upper wall 46 is formed in such a manner that its diameter is increased toward the horizontal direction or the upper direction, and an upper edge thereof is formed to be continuous with the cylindrical portion 37. It is to be noted that an annular heat storage member 47 is provided in the bulge portion 41 surrounded by the lower part of the cylindrical portion 37, the bottom wall 42, the vertical wall 44 and the upper wall 46. The heat storage member 47 in this embodiment is formed by filling a felt material consisting of carbon fibers in the bulge portion 41. The heat storage member 47 provided in the bulge portion 41 is formed in such a manner that its inner peripheral surface parallel with an axis center line of the ingot 25 is formed by the vertical wall 44 constituting the bulge portion 41, a height $H_1$ of the inner peripheral surface of the heat storage member 47 is not smaller than 10 mm and not greater than d/2, and a minimum gap $W_1$ between the inner peripheral surface of the heat storage member 47 and the outer peripheral surface of the ingot 25 is not smaller than 10 mm and not greater than 35 mm, where d is a diameter of the ingot 25. It is to be noted that the height $H_1$ is restricted to a range of 10 mm to d/2 mm because radiant heat from the silicon melt cannot be sufficiently insulated when it is less than 10 mm and heat radiation from a single-crystal rod is hard to be facilitated and hence a pulling rate cannot be increased when it exceeds d/2 mm. Furthermore, the minimum gap $W_1$ is restricted to a range of 10 to 0.2d because the bulge portion and the single-crystal rod may possibly come into contact with each other when it is less than 10 mm and radiant heat from the silicon melt cannot be sufficiently insulated when it exceeds 0.2d.

As shown in FIGS. 1 and 2, an upper coil 51 and a lower coil 52 each having a coil diameter larger than an external diameter of the chamber 11 are arranged with a predetermined gap therebetween in a perpendicular direction outside the chamber 11 with the rotation axis of the quartz crucible 13 being determined at each coil center. Moreover, a cusp magnetic field 53 which runs through a neutral plane 53a between the upper coil and the lower coil from the respective coil centers of the upper coil and the lower coil is generated by allowing opposite currents to flow through the upper coil 51 an the lower coil 52. Although not shown, the upper coil 51 and the lower coil 52 may have the same or different sizes.

A silicon single crystal pulling method using the above-mentioned apparatus will now be described.

This pulling method is a method of pulling the ingot 25 including a top-side ingot 25a and a bottom-side ingot 25b from the silicon melt 12 while applying the cusp magnetic field 53 to the silicon melt 12 by using the upper coil 51 and the lower coil 52. As shown in FIG. 2 in detail, opposite currents are caused to flow through the upper coil 51 and the lower coil 52, whereby the cusp magnetic field 53 which runs through the neutral plane 53a between the upper coil 51 and the lower coil 52 from the respective coil centers of the upper coil 51 and the lower coil 52 is generated. It is to be noted that the neutral plane 53a is a horizontal plane between the upper coil 51 and the lower coil 52 where a magnetic field intensity in the perpendicular direction becomes zero. Additionally, an intensity of the cusp magnetic field 53 is controlled to be 50 gausses or above. Here, the magnetic field intensity is a horizontal intensity of the cusp magnetic field on a circumference which is 300 mm apart from an intersection of the rotation axis of the quartz crucible on the neutral plane of the cusp magnetic field.

Again referring to FIG. 1, then, an inert gas is supplied into the chamber 11 from the upper part of the chamber 11 by adjusting the first and second flow quantity adjusting-valves 31 and 32. Supplying the inert gas effectively discharges an SiO gas generated from the silicon melt to the outside of the furnace, and this inert gas flows down between the bulge portion 41 and the ingot 25 to provide an effect of cooling the crystal, an effect of changing a convection by cooling the melt, and other effects. It is to be noted that the inert gas which has flowed down between the bulge portion 41 and the ingot 25 then passes between the surface of the silicon melt 12 and the lower end of the heat shielding member 26 to be discharged toward the outside from the discharge pipe 30. Furthermore, the ingot 25 is pulled upward from the silicon melt 12 by pulling up the seed crystal 24 dipped in the silicon melt 12 while rotating the quartz crucible 13 in which the silicon melt 12 is trapped at a predetermined rotation speed and rotating the seed crystal 24 in a direction opposite to that of the quartz crucible 13 at a predetermined rotation speed. The seed crystal 24 is pulled upward with a predetermined pulling rate profile which provides a perfect region where interstitial silicon point defect agglomerates and vacancy point defect agglomerates do not exist in the ingot 25.

Moreover, the ingot 25 has the top-side ingot 25a which is pulled up continuously with the seed crystal 24 and the bottom-side ingot 25b which is pulled up continuously with this top-side ingot. Ranges of the top-side ingot 25a and the bottom-side ingot 25b are determined based on a solidification ratio of the ingot 25 to be pulled up. Specifically, as shown in FIG. 4, the top-side ingot 25a means a part having a solidification ratio of 0.15 to 0.30, and the bottom-side ingot 25b means a part having a solidification ratio of 0.50 to 0.65. It is to be noted that the solidification ratio means a ratio of a pulling weight of the ingot 25 with respect to an initial charge weight of the silicon melt 12 first trapped in the quartz crucible 13.

Here, a flow quantity of the inert gas flowing down between the bulge portion 41 and the ingot 25 when pulling up the top-side ingot 25a is adjusted to be larger than a flow quantity of the inert gas flowing down between the bulge portion 41 and the ingot 25 when pulling up the bottom-side ingot 25b. In this embodiment, as shown in FIG. 5, a flow quantity of the inert gas is adjusted to be reduced by a fixed quantity when pulling up the bottom-side ingot 25b. It can be considered that a concentration of oxygen which is removed from the silicon melt surface is reduced and a quantity of oxygen which is taken into the crystal in the bottom-side ingot 25b is increased by adjusting in this manner. As a result, in the method according to the present invention, as shown in FIG. 6, it is possible to manufacture the silicon single crystal ingot having a relatively uniform oxygen concentration.

In this case, a flow rate index S of the inert gas flowing down between the bulge portion 41 and the ingot 25 when pulling up the top-side ingot 25a is set higher than a flow rate index S of the inert gas flowing down between the bulge portion 41 and the ingot 25 when pulling up the bottom-side ingot 25b. Here, the flow rate index S is a value obtained by the following Equation (1):

$$S = (Po/E) \times F/A \quad (1)$$

In Equation (1), Po is an atmospheric pressure (Pa) outside the chamber 11, E is an internal pressure (Pa) of the chamber 11, F is a flow quantity (m³/second) under the pressure Po (Pa) of the inert gate supplied into the chamber 11 in a room temperature state, and A is a cross-sectional area (m²) between the bulge portion 41 and the ingot 25.

When the ingot 25 is pulled upward under the above-described conditions, since the flow quantity of the inert gas flowing down between the bulge portion 41 and the ingot 25 at the time of pulling the top-side ingot 25a is set larger than the flow quantity of the inert gas flowing down between the bulge portion 41 and the ingot 25 at the time of pulling up the bottom-side ingot 25b and the flow rate index S of the inert gas of the top-side ingot 25a is set higher than the flow rate index S of the inert gas of the bottom-side ingot 25b, it can be reckoned that a change in a convection of the silicon melt 12 due to a reduction in the silicon melt 12 in the quartz crucible 13 involved by pulling the ingot 25 can be suppressed to the minimum level. As a result, it can be considered that a temperature gradient G in a perpendicular direction of the ingot 25 in the vicinity of the solid-liquid interface between the silicon melt 12 and the ingot 25 is substantially uniformly distributed in a radial direction of the ingot 25 over the substantially entire length of the ingot 25, point defect agglomerates are not generated in a direction of pulling the ingot 25, and the ingot 25 which has the perfect region along the substantially entire length thereof can be pulled upward. Therefore, according to such a silicon single crystal pulling method, it can be considered that the silicon single crystal ingot in which point defect agglomerates do not exist over the substantially entire length can be manufactured without reducing a pure margin. Here, as shown in FIG. 8, the pure margin means a difference $(V_2-V_1)$, $(V_2'-V_1')$ between a critical pulling rate $V_2$, $V_2'$ which provides the perfect region in which an OISF ring does not exist across the entire lateral cross section of the ingot and a lower limit $V_1$, $V_1'$ of a pulling rate at which interstitial silicon point defect agglomerates are not generated. Thereafter, in this description, when referring to the pure margin, $(V_2-V_1)$ will be written on behalf of the pure margin, and the description of $(V_2'-V_1')$ will be eliminated.

It is to be noted that a flow quantity of the inert gas is adjusted to be reduced by a fixed quantity when pulling up the bottom-side ingot 25b in the first embodiment, but the flow quantity of the inert gas may be changed to be reduced in a pattern appropriate for controlling oxygen as shown in FIG. 7 as long as the flow quantity of the inert gas flowing down between the bulge portion 41 and the ingot 25 when pulling up the top-side ingot 25a is larger than the flow quantity of the inert gas flowing down between the bulge portion 41 and the ingot 25 when pulling up the bottom-side ingot 25b.

A second embodiment according to the present invention will now be described with reference to the accompanying drawings.

In this second embodiment, by adjusting first and second flow quantity adjusting valves 31 and 32, a fixed quantity of an inert gas is supplied into a chamber 11 from an upper part of the chamber 11, and a flow rate of the inert gas flowing down between a bulge portion 41 and an ingot 25 is adjusted to 5 m/s or below, preferably 2.4 to 5.0 m/s. Further, the ingot 25 is pulled up from a silicon melt 12 by pulling up a seed crystal 24 dipped in the silicon melt 12 while rotating a quartz crucible 13 in which the silicon melt 12 is trapped at a predetermined rotation speed and rotating the seed crystal 24 in a direction opposite to that of the quartz crucible 13 at a predetermined rotation speed. The seed crystal 24 is pulled upward with a predetermined pulling rate profile which provides a perfect region in which interstitial silicon point defect agglomerates and vacancy point defect agglomerates do not exit in the ingot 25.

When actually pulling up the ingot 25, an intensity of a cusp magnetic field 53 at the time of pulling up a top-side ingot 25a of the silicon single crystal ingot 25 is set higher than an intensity of the cusp magnetic field 53 at the time of pulling up a bottom-side ingot 25b of the silicon single crystal ingot 25. In this embodiment, as shown in FIG. 9, when pulling up the top-side ingot 25a, its magnetic field intensity is set to fall within a range of 200 gausses to 300 gausses, and the intensity of the cusp magnetic field 53 is gradually changed to exceed 0 gauss and become less than 200 gausses. Any other points are the same as those in the first embodiment, thereby eliminating the tautological explanation.

As shown in FIG. 2, when the cusp magnetic field 53 is generated, a Lorentz force is applied to the silicon melt 12, and free movement of the silicon melt 12 trapped in the quartz crucible 13 is inhibited. Furthermore, when the intensity of the cusp magnetic field 53 when pulling up the bottom-side ingot 25b is set lower than the intensity of the cusp magnetic field 53 when pulling up the top-side ingot 25a, the Lorentz force caused due to an induced current generated in the silicon melt 12 by the magnetic field is lowered as compared with that in the case where the top-side ingot 25a is pulled upward, and an influence of a natural convection is considered to become large. Although a dissolving quantity of the quartz is considered to be reduced to lower an oxygen concentration by a decrease in a contact area of the melt and the quart crucible on the bottom side, it is conceived that a reduction in the magnetic field intensity greatens an influence of the natural convection to increase the dissolving quantity of the quartz. As a result, a quantity of oxygen which is taken into the crystal is also increased. Consequently, the method according to the present invention can manufacture the silicon single crystal ingot having such a relatively uniform oxygen concentration as shown in FIG. 10.

On the other hand, when the magnetic field intensity is changed as described above, it is considered that a temperature gradient G in a perpendicular direction of the ingot 25 in the vicinity of a solid-liquid interface between the silicon melt 12 and the ingot 25 is substantially uniformly distributed in a radial direction of the ingot 25 over a substantially entire length of the ingot 25, point defect agglomerates are not generated in a direction of pulling the ingot 25, and the ingot 25 having a perfect region over the substantially entire length thereof can be pulled upward. Therefore, according to such a silicon single crystal pulling method, it is considered that the silicon single crystal ingot in which point defect agglomerates do not exist over the substantially entire length thereof can be manufactured without reducing a pure margin.

It is to be noted that the description has been given on the case where the magnetic field intensity is gradually changed in the second embodiment, but the magnetic field intensity may be changed to be reduced at a fixed ratio as shown in FIG. 11.

EXAMPLES

Examples according to the present invention will now be described.

Example 1

First, 120 kg of a polysilicon (silicon polycrystal) raw material was charged and an ingot 25 having a diameter of approximately 200 mm was pulled upward by using a pulling apparatus 10 shown in FIG. 1. When performing this pulling operation, a cusp magnetic field 53 of 200 gausses was generated. Moreover, a flow quantity of an inert gas flowing down between a bulge portion 41 and the ingot 25 at the time of pulling was set to a fixed value, i.e., 110 liters/min in a room temperature reduction (a flow quantity of the inert gas will be thereafter reduced to a room temperature). The ingot pulled up at a predetermined pulling rate was determined as Example 1.

Example 2

An ingot was pulled up like Example 1 except that a flow quantity of an inert gas flowing down between a bulge portion 41 and the ingot 25 is set to a fixed value, i.e., 90 liters/min. This ingot was determined as Example 2.

Example 3

An ingot was pulled up like Example 1 except that an intensity of a cusp magnetic field was set to 100 gausses. This ingot was determined as Example 3.

<Comparison Test and Evaluation>

After slicing the ingots of Examples 1 to 3 in an axial direction, a predetermined heat treatment was performed to measure a lifetime, and an upper limit $V_2$ of a pulling rate and a pure margin $(V_2-V_1)$ shown in FIG. 8 with which interstitial silicon point defect agglomerates are not generated and an oxygen concentration were obtained with respect to each of a top-side ingot 25a and a bottom-side ingot 25b. Table 1 shows a result. It is to be noted that each value is represented as a relative value assuming that a value of the top-side ingot of Example 1 is 1.0.

TABLE 1

| | Flow Quantity of argon (1/min) | Magnetic field intensity (gauss) | Top-side ingot | | | Bottom-side ingot | | |
|---|---|---|---|---|---|---|---|---|
| | | | Oi (relative value) | $V_2$ (relative value) | $V_2 - V_1$ (relative value) | Oi (relative value) | $V_2$ (relative value) | $V_2 - V_1$ (relative value) |
| Example 1 | 110 | 200 | 1.0 | 1.0 | 1.0 | 0.82 | 0.97 | 1.6 |
| Example 2 | 90 | 200 | 1.05 | 0.97 | 0.0 | 0.90 | 1.04 | 1.8 |
| Example 3 | 110 | 100 | 1.05 | 0.99 | 0.4 | 0.94 | 1.02 | 1.8 |

As obvious from Table 1, although the pure margin is 0.0 in the top-side ingot 25a of Example 2, the pure margin is 1.0 (a relative value) in the top-side ingot 25a of Example 1. On the other hand, an oxygen concentration of the bottom-side ingot of Example 1 is lower than that of the top-side ingot of the same, and this reduction shows a value lower than an oxygen concentration of the bottom-side ingot of Example 2. Therefore, it is considered that, by adjusting a flow quantity of the inert gas flowing down between the bulge portion 41 and the ingot 25 when pulling up the top-side ingot 25a to be larger than a flow quantity of the inert gas flowing down between the bulge portion 41 and the ingot 25 when pulling up the bottom-side ingot 25b, a silicon single crystal ingot in which point defect agglomerates do not exist over the substantially entire length can be manufactured without reducing an oxygen concentration.

Moreover, although a pure margin is 0.4 (a relative value) in the top-side ingot 25a of Example 3, a pure margin is 1.0 (a relative value) in the top-side ingot 25a of Example 1. On the other hand, an oxygen concentration of the bottom-side ingot is lower than that of the top-side ingot in Example 1, and this reduction shows a value lower than an oxygen concentration of the bottom-side ingot in Example 3. Therefore, it is considered that, by setting an intensity of the cusp magnetic field 53 when pulling up the top-side ingot 25a to be larger than an intensity of the cusp magnetic field 53 when pulling up the bottom-side ingot 25b of the silicon single crystal ingot 25, a silicon single crystal ingot in which point defect agglomerates do not exist over the substantially entire length thereof can be manufactured without reducing an oxygen concentration.

REFERENCE NUMERALS

Figure 1:
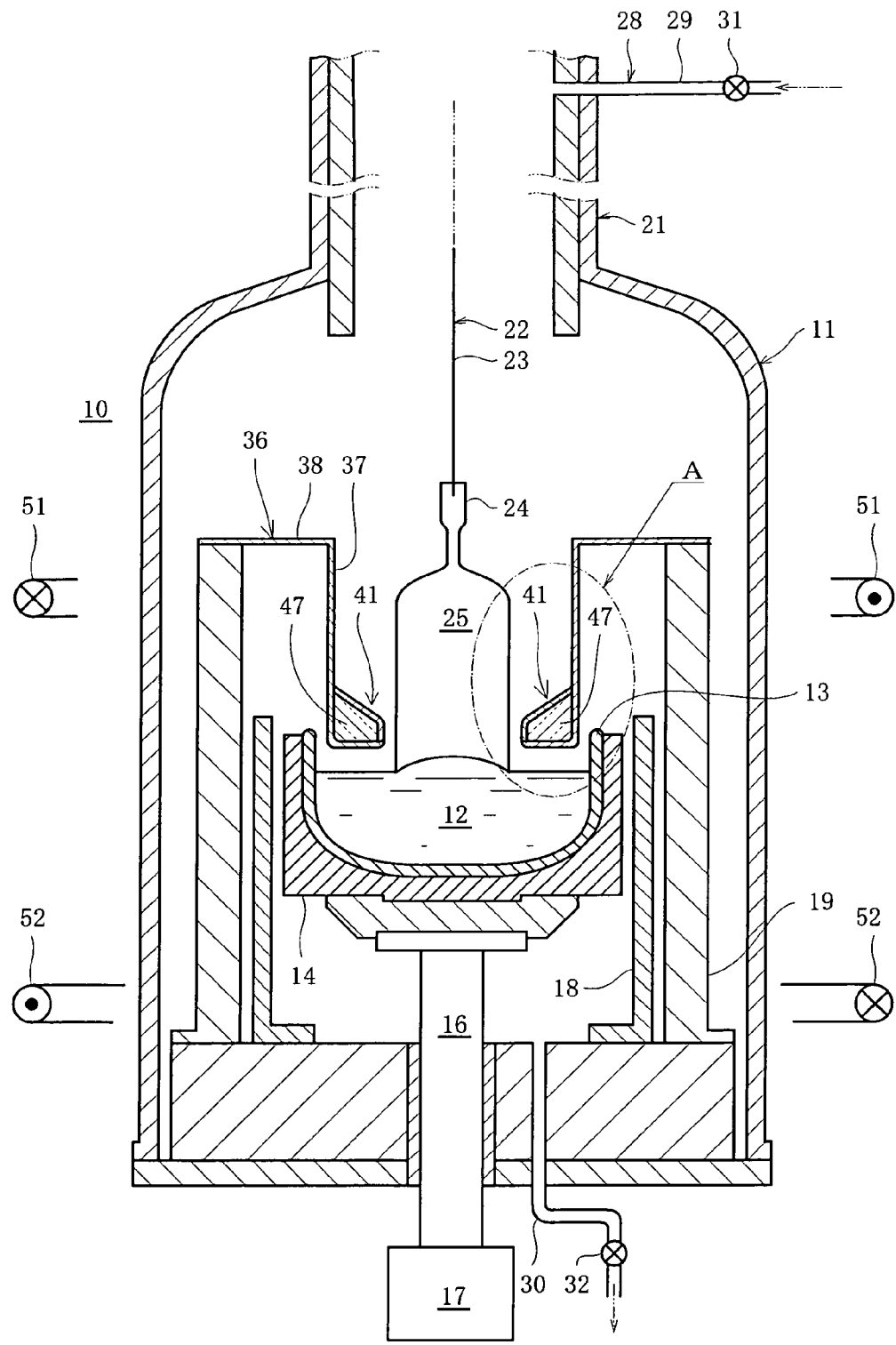
FIG. 1 is a cross-sectional block diagram showing a pulling apparatus used in a method according to the present invention.
Figure 2:
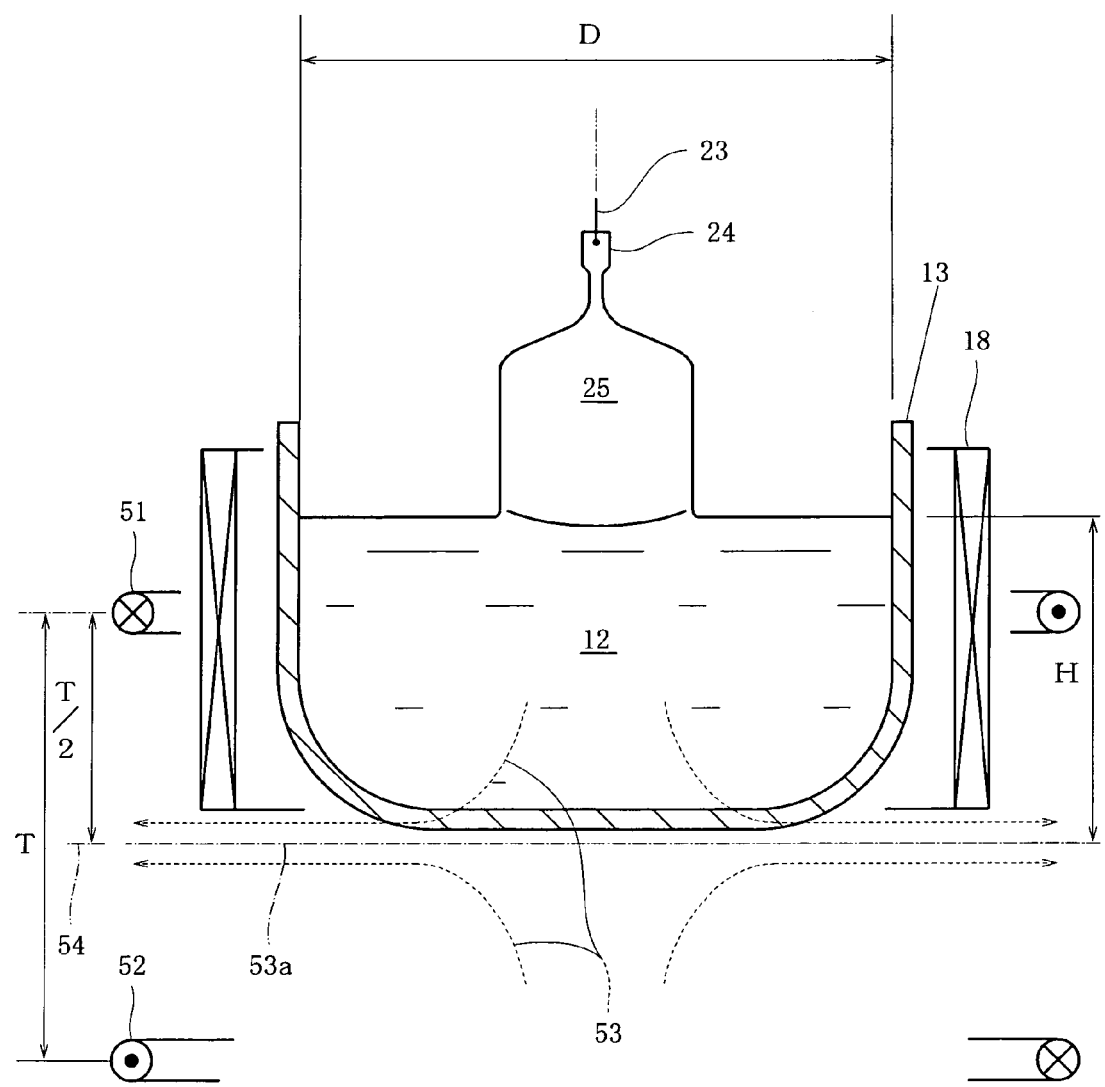
FIG. 2 is a cross-sectional block diagram showing a state where a silicon single crystal ingot is pulled up while applying a cusp magnetic field by this apparatus.
Figure 3:
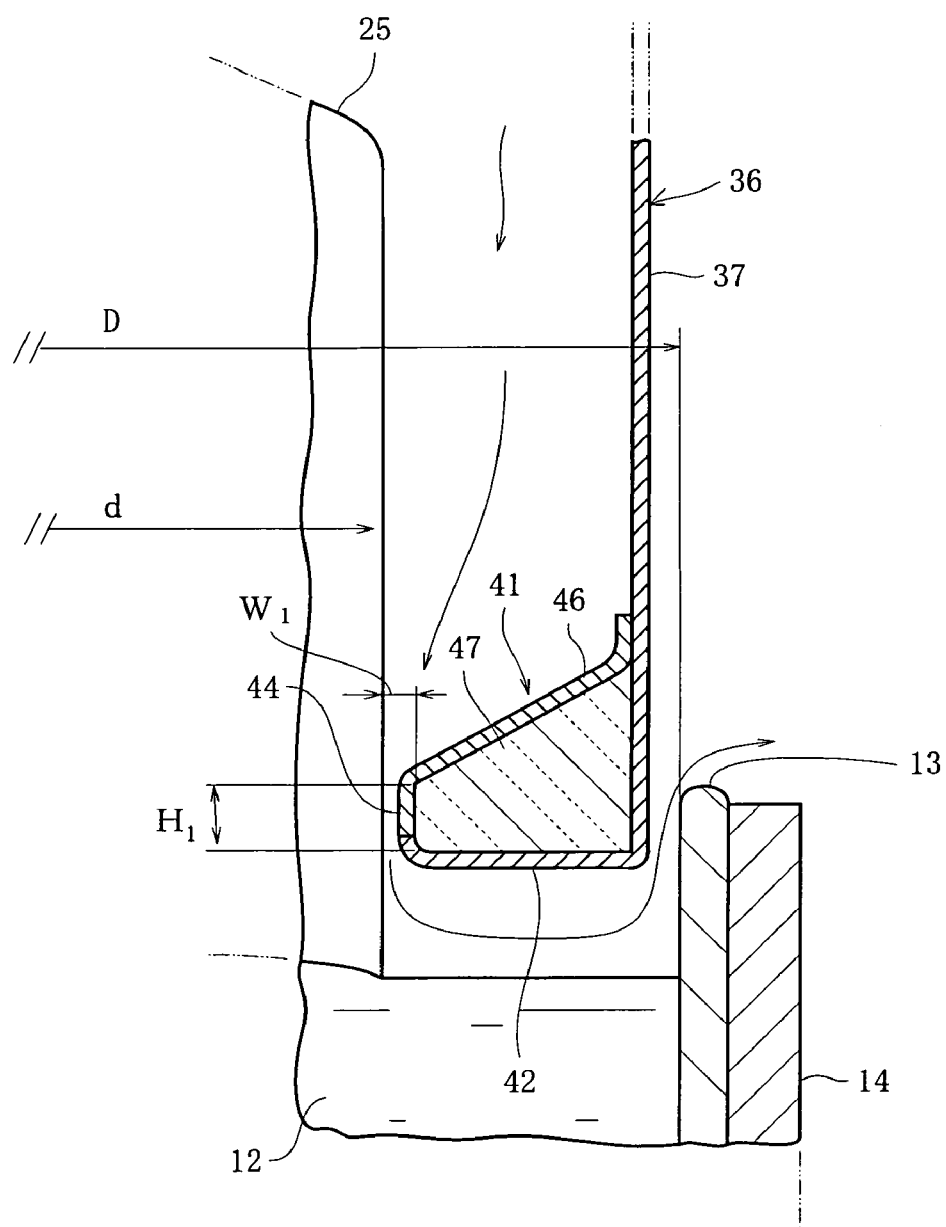
FIG. 3 is an enlarged cross-sectional view of a part A in FIG. 1, showing a heat shielding member of this apparatus.
Figure 4:
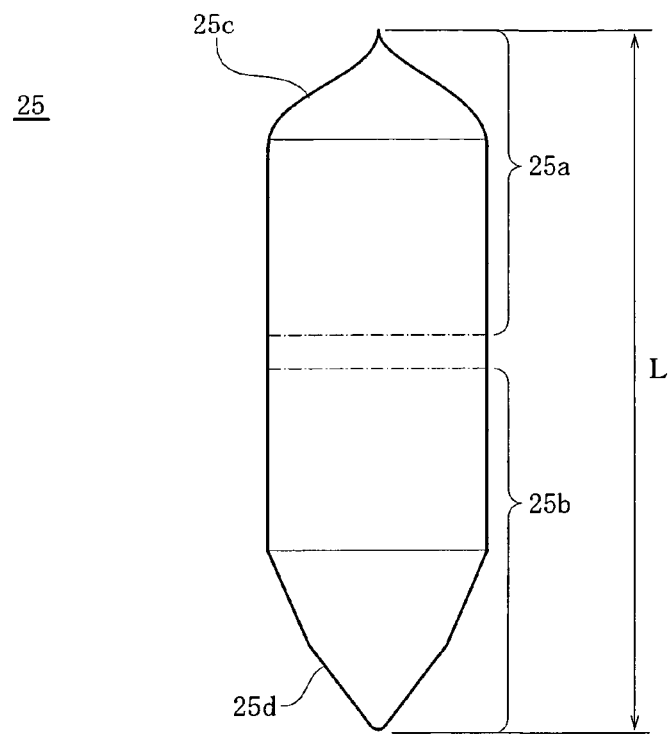
FIG. 4 is a view showing an ingot pulled up by this apparatus.
Figure 5:
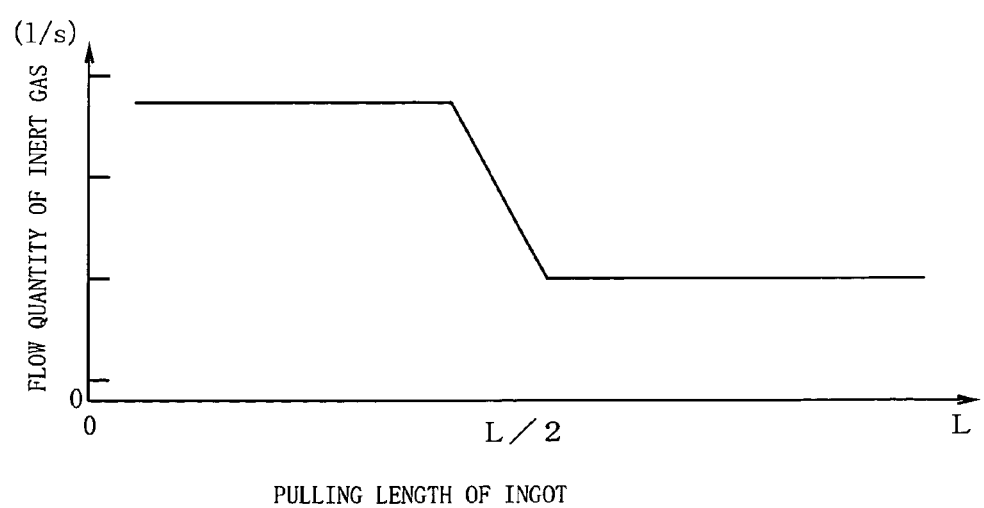
FIG. 5 is a view showing a state where a flow quantity of an inert gas is changed according to a first embodiment.
Figure 6:
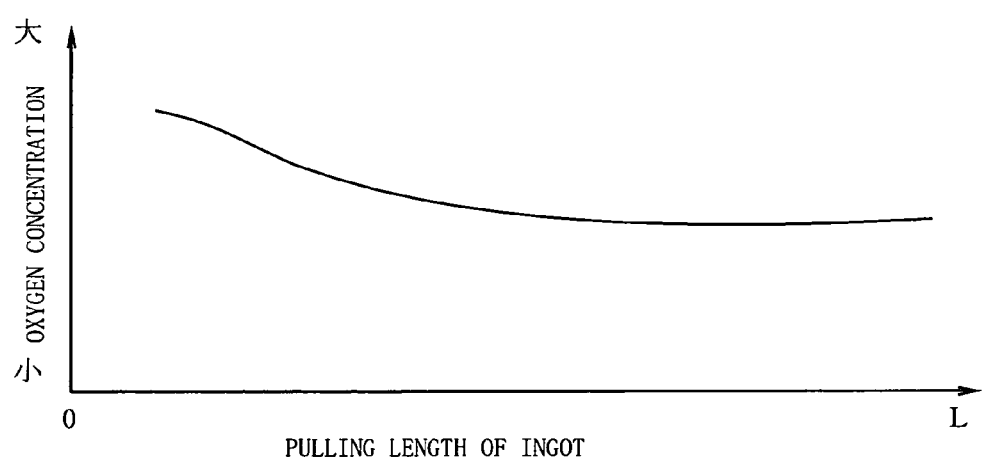
FIG. 6 is a view showing a relationship between a length of the ingot pulled up by this apparatus and an oxygen concentration.
Figure 7:
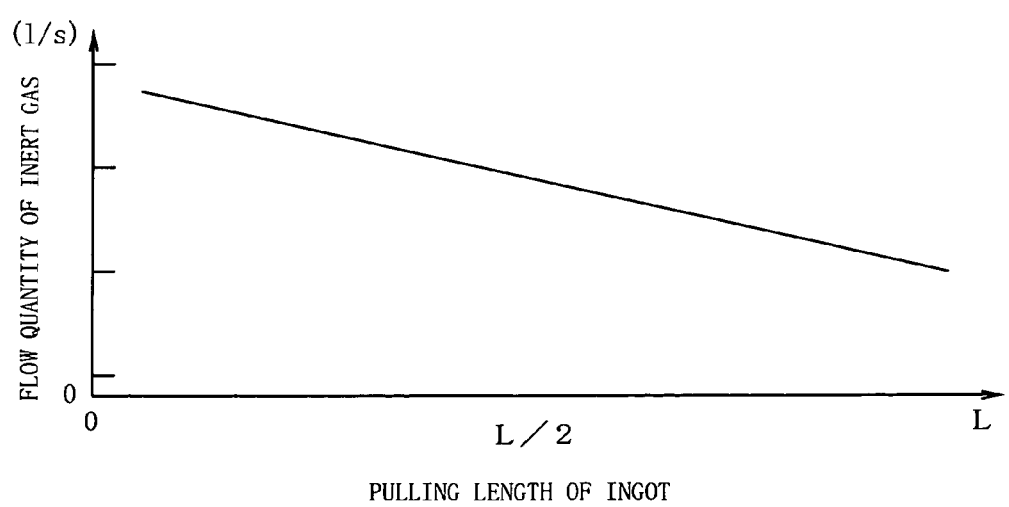
FIG. 7 is a view showing another state where a flow quantity of the inert gas is changed according to the first embodiment.
Figure 8:
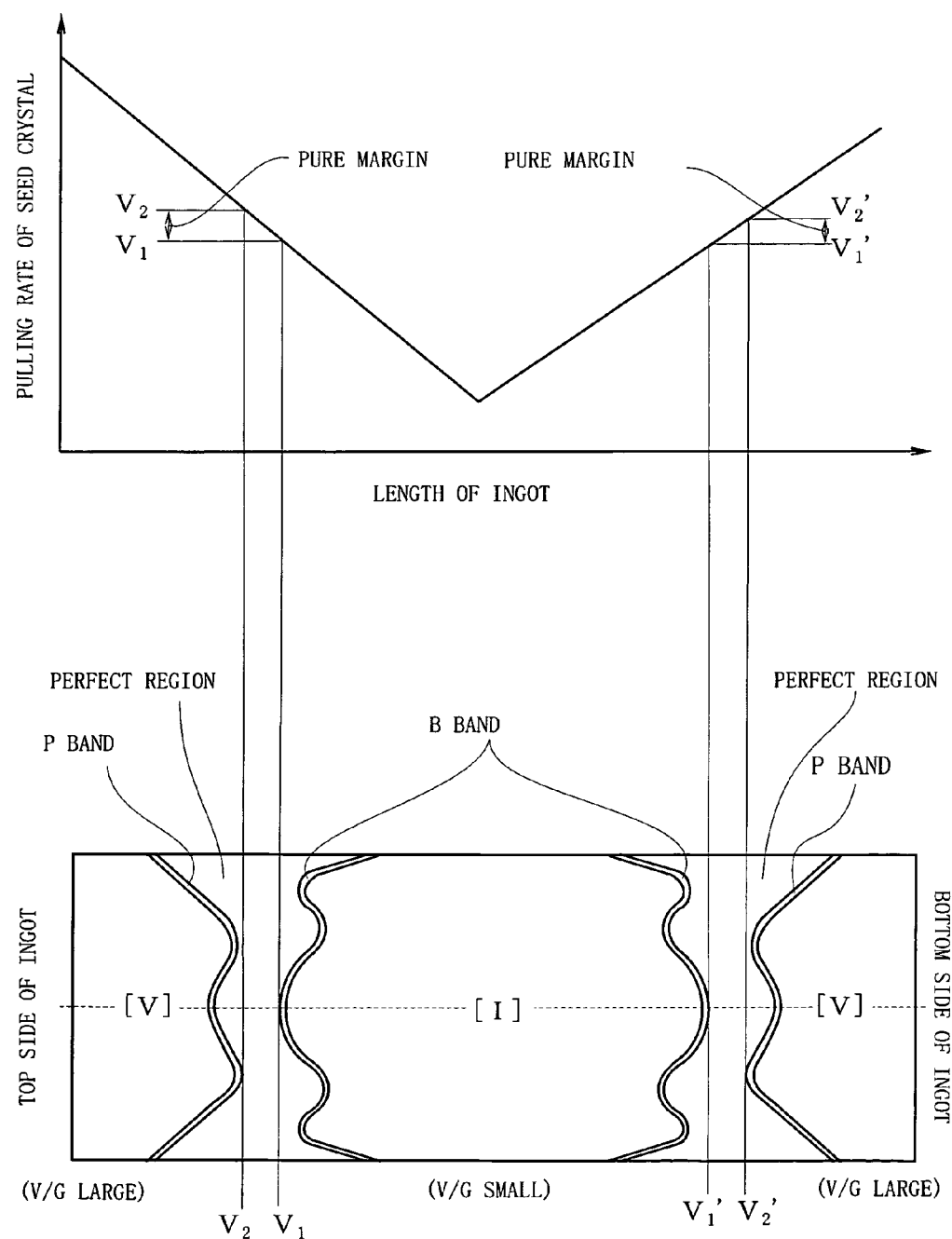
FIG. 8 is an explanatory view showing a distribution of interstitial silicon and holes in the ingot when the ingot is pulled up at a predetermined variable pulling rate.
Figure 9:
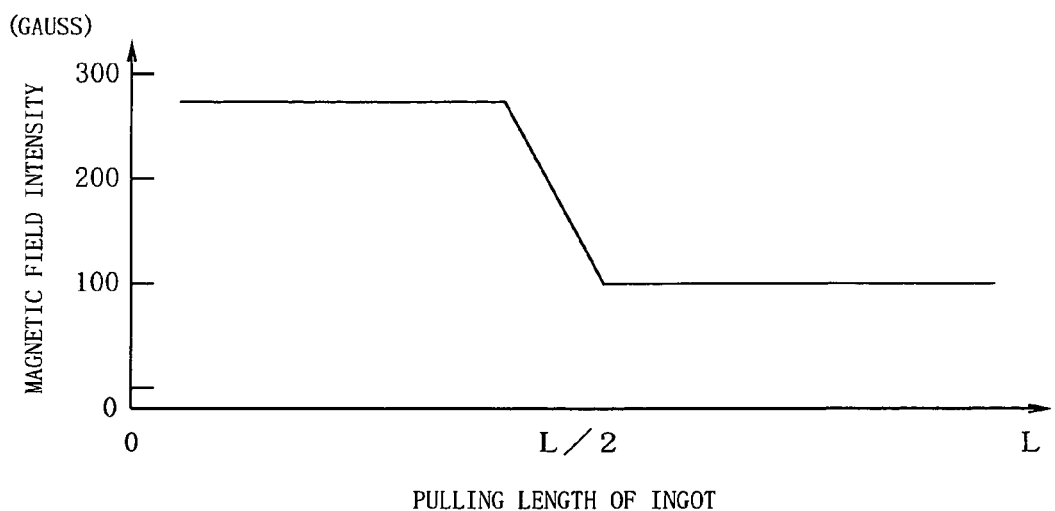
FIG. 9 is a view showing a state where a magnetic field intensity is changed in a second embodiment.
Figure 10:
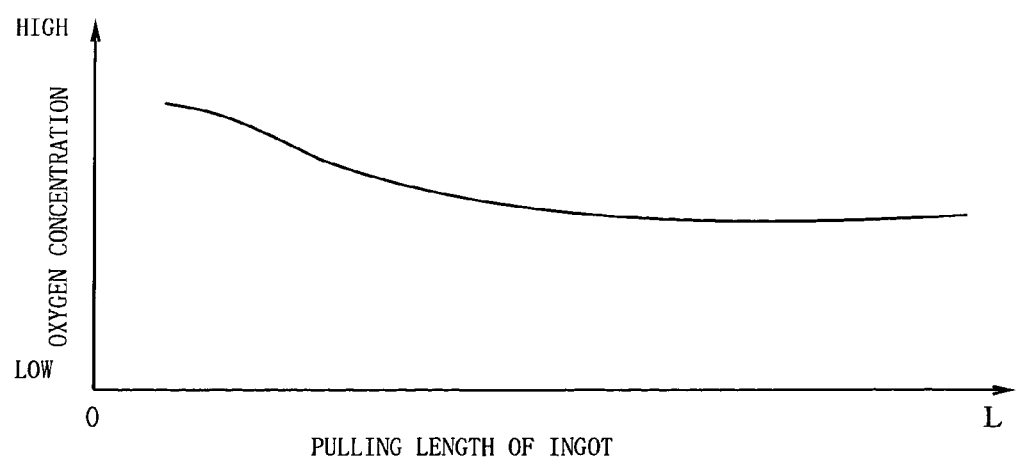
FIG. 10 is a view showing a relationship between a length of an ingot pulled up and an oxygen concentration.
Figure 11:
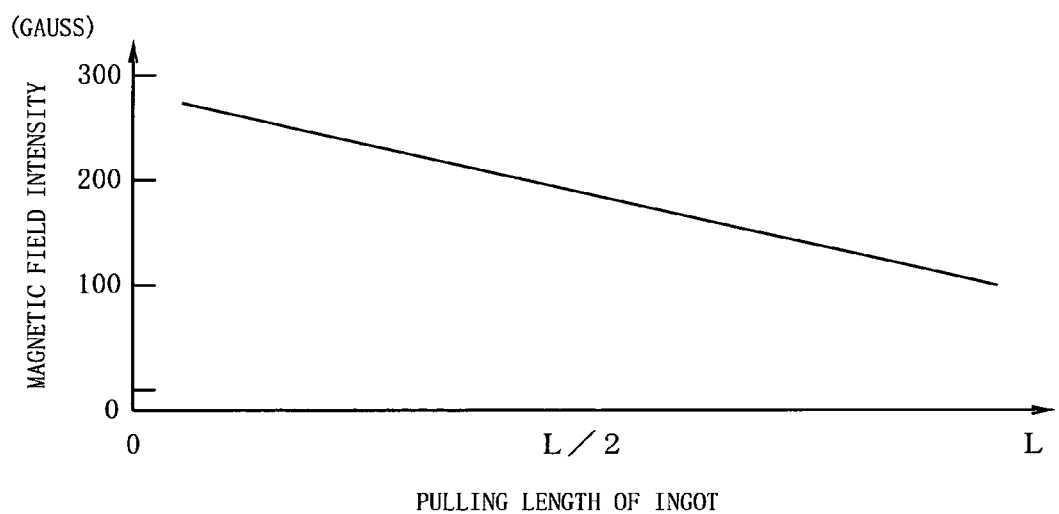
FIG. 11 is a view showing another state where a magnetic field intensity is changed in the second embodiment.
Figure 12:
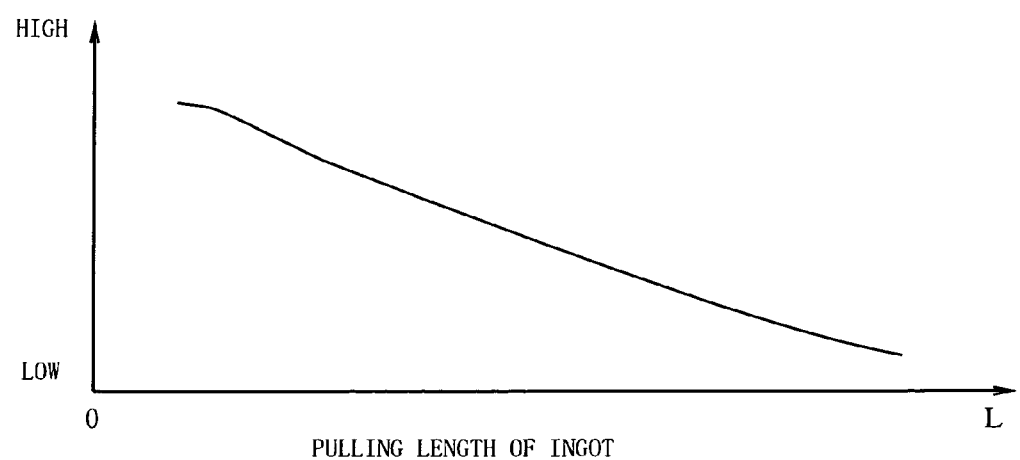
FIG. 12 is a view showing a relationship between a length of an ingot pulled up by a conventional method and an oxygen concentration.

11 Chamber
13 quartz crucible
12 silicon melt
25 silicon single crystal ingot
25a top-side ingot
25b bottom-side ingot
36 heat shielding member
37 cylindrical portion
41 bulge portion
47 heat storage member
51 upper coil
52 lower coil
53 cusp magnetic field
53a neutral plane
d diameter of the ingot
D internal diameter of the quartz crucible
H distance between a surface of the silicon melt and the neutral plane
$H_1$ height of an inner peripheral surface of the heat storage member
$W_1$ minimum gap between the heat storage member and an outer peripheral surface of the ingot

The invention claimed is:

1. A silicon single crystal pulling method comprising:
   arranging an upper coil (51) and a lower coil (52) with a predetermined gap therebetween in a perpendicular direction outside a chamber (11) in which a quartz crucible (13) is provided;

generating a cusp magnetic field (53) having an intensity of 50 gausses or above which runs through a neutral plane (53a) between the upper coil (51) and the lower coil (52) from respective coil centers of the upper coil (51) and the lower coil (52) by allowing opposite currents to flow through the upper coil (51) and the lower coil (52);

rotating the quartz crucible (13) at a predetermined rotation speed;

supplying an inert gas into the chamber (11) from an upper part of the chamber (11) so that the inert gas flows down in a heat shielding member (36) provided in the chamber (11);

rotating a silicon single crystal ingot (25) including a top-side ingot (25a) and a bottom-side ingot (25b) from the silicon melt (12) at a predetermined rotation speed; and pulling up the silicon single crystal ingot (25) from a center of the heat shielding member (36) at a pulling rate with which a perfect region where interstitial silicon point defect agglomerates and vacancy point defect agglomerates do not exist is provided in the silicon single crystal ingot (25), wherein the heat shielding member (36) comprises:

a cylindrical portion (37) whose lower end is positioned above a surface of the silicon melt (12) with a gap therebetween and which surrounds an outer peripheral surface of the ingot (25); and a bulge portion (41) which is provided to bulge in an in-cylinder direction at a lower portion of the cylindrical portion (37) and has a heat storage member (47) provided therein, wherein an inner peripheral surface of the heat storage member (47) is formed in such a manner that a height ($H_1$) is not smaller than 10 mm and not greater than d/2 and a minimum gap ($W_1$) with respect to the outer peripheral surface of the ingot (25) is not smaller than 10 mm and not greater than 0.2 d where d is a diameter of the ingot (25) and not smaller than 100 mm, and wherein a flow quantity of the inert gas flowing down between the bulge portion (41) and the ingot (25) when pulling up the top-side ingot (25a) of the silicon single crystal ingot (25) is larger than a flow quantity of the inert gas flowing down between the bulge portion (41) and the ingot (25) when pulling up the bottom-side ingot (25b) of the silicon single crystal ingot (25).

2. The silicon single crystal pulling method according to claim 1, wherein a flow rate index (S) obtained by the following Equation (1) of the inert gas flowing down between the bulge portion (41) and the ingot (25) when pulling up the top-side ingot (25a) is set higher than a flow rate index (S) obtained by the following Equation (1) of the inert gas flowing down between the bulge portion (41) and the ingot (25) when pulling up the bottom-side ingot (25b):

$$S = (Po/F) \times F/A \tag{1}$$

where Po is an atmospheric pressure (Pa) outside the chamber (11), E is an internal pressure (Pa) of the chamber (11), F is a flow quantity (m³/second) under the pressure Po (Pa) of the inert gas supplied to the chamber (11) in a room temperature state, and A is a cross-sectional area (m²) between the bulge portion (41) and the silicon single crystal ingot (25).

3. A silicon single crystal pulling method comprising:

arranging an upper coil (51) and a lower coil (52) with a predetermined gap therebetween in a perpendicular direction outside a chamber (11) in which a quartz crucible (13) is provided;

generating a cusp magnetic field (53) which runs through a neutral plane (53a) between the upper coil (51) and the lower coil (52) from respective coil centers of the upper coil (51) and the lower coil (52) by allowing opposite currents to flow through the upper coil (51) and the lower coil (52);

rotating the quartz crucible (13) at a predetermined rotation speed;

supplying an inert gas into the chamber (11) from an upper part of the chamber (11) so that the inert gas flows down in a heat shielding member (36) provided in the chamber (11);

rotating a silicon single crystal ingot (25) including a top-side ingot (25a) and a bottom-side ingot (25b) from the silicon melt (12) at a predetermined rotation speed; and pulling up the silicon single crystal ingot (25) from a center of the heat shielding member (36) at a pulling rate with which a perfect region where interstitial silicon point defect agglomerates and vacancy point defect agglomerates do not exist is provided in the silicon single crystal ingot (25), wherein the heat shielding member (36) comprises:

a cylindrical portion (37) whose lower end is positioned above a surface of the silicon melt (12) with a gap therebetween and which surrounds an outer peripheral surface of the ingot (25); and a bulge portion (41) which is provided to bulge in an in-cylinder direction at a lower portion of the cylindrical portion (37) and has a heat storage member (47) provided therein, wherein an inner peripheral surface of the heat storage member (47) is formed in such a manner that its height ($H_1$) is not smaller than 10 mm and not greater than d/2 and its minimum gap ($W_1$) with respect to the outer peripheral surface of the ingot (25) is not smaller than 10 mm and not greater than 0.2 d mm where d is a diameter of the ingot (25) and not smaller than 100 mm, and wherein an intensity of the cusp magnetic field (53) when pulling up the top-side ingot (25a) of the silicon single crystal ingot (25) is set higher than an intensity of the cusp magnetic field (53) when pulling up the bottom-side ingot (25b) of the silicon single crystal ingot (25).

* * * * *